United States Patent
Kwak et al.

(10) Patent No.: US 9,653,368 B2
(45) Date of Patent: May 16, 2017

(54) DISPLAY DEVICE AND METHOD OF FABRICATING THE SAME

(71) Applicant: SAMSUNG DISPLAY CO., LTD., Yongin, Gyeonggi-Do (KR)

(72) Inventors: Won-Kyu Kwak, Yongin (KR); Hwan-Soo Jang, Yongin (KR); Jae-Yong Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/705,166

(22) Filed: May 6, 2015

(65) Prior Publication Data

US 2016/0043010 A1    Feb. 11, 2016

(30) Foreign Application Priority Data

Aug. 6, 2014   (KR) .................... 10-2014-0101136

(51) Int. Cl.
| | | |
|---|---|---|
| *H01L 21/66* | (2006.01) | |
| *G09G 3/00* | (2006.01) | |
| *H01L 27/12* | (2006.01) | |
| *G09G 3/3225* | (2016.01) | |

(52) U.S. Cl.
CPC ............ *H01L 22/32* (2013.01); *G09G 3/006* (2013.01); *H01L 22/14* (2013.01); *H01L 27/124* (2013.01); *H01L 27/1259* (2013.01); *G09G 3/3225* (2013.01); *G09G 2330/12* (2013.01)

(58) Field of Classification Search
CPC .......... H01L 22/32; G09G 3/006; G09G 3/36; H02S 50/00

USPC .......................................................... 257/48
See application file for complete search history.

(56) References Cited

U.S. PATENT DOCUMENTS

| | | | |
|---|---|---|---|
| 8,665,249 B2 | 3/2014 | Suh | |
| 2007/0018680 A1* | 1/2007 | Jeon ........................ | G09G 3/006 324/750.3 |
| 2009/0251455 A1* | 10/2009 | Park ..................... | G09G 3/2007 345/214 |
| 2009/0262048 A1 | 10/2009 | Park et al. | |
| 2011/0018571 A1 | 1/2011 | Kim et al. | |
| 2011/0080173 A1 | 4/2011 | Kim et al. | |

(Continued)

FOREIGN PATENT DOCUMENTS

| | | |
|---|---|---|
| KR | 10-2007-0111717 A | 11/2007 |
| KR | 10-2009-0105027 A | 10/2009 |

(Continued)

OTHER PUBLICATIONS

European Office Action dated Dec. 7, 2015 in Corresponding European Patent Application No. 15180084.4.

*Primary Examiner* — Cuong Q Nguyen
*Assistant Examiner* — Nishath Yasmeen
(74) *Attorney, Agent, or Firm* — Lee & Morse, P.C.

(57) ABSTRACT

A display device includes a display area, a test pad, a plurality of first test transistors, and at least one outline. The display area includes pixels coupled to data lines and scan lines. The test pad receives a test signal. The first test transistors are coupled between the data lines of the display area and the test pad. The at least one outline is coupled between one of the first test transistors and the test pad. The at least one outline is located in a non-display area outside the display area.

13 Claims, 11 Drawing Sheets

(56) References Cited

U.S. PATENT DOCUMENTS

| | | | |
|---|---|---|---|
| 2011/0186798 A1* | 8/2011 | Kwon | H01L 45/06 257/2 |
| 2012/0139829 A1 | 6/2012 | Anno et al. | |
| 2013/0175494 A1* | 7/2013 | Collins | H01L 45/085 257/4 |
| 2013/0200320 A1* | 8/2013 | Goux | H01L 45/04 257/1 |
| 2014/0036570 A1* | 2/2014 | Lee | G11C 13/0004 365/148 |
| 2014/0167769 A1 | 6/2014 | Kim et al. | |
| 2014/0176844 A1 | 6/2014 | Yanagisawa | |

FOREIGN PATENT DOCUMENTS

| | | |
|---|---|---|
| KR | 10-2010-0010594 | 2/2010 |
| KR | 10-1064403 B1 | 9/2011 |
| KR | 10-1300914 B1 | 8/2013 |

\* cited by examiner

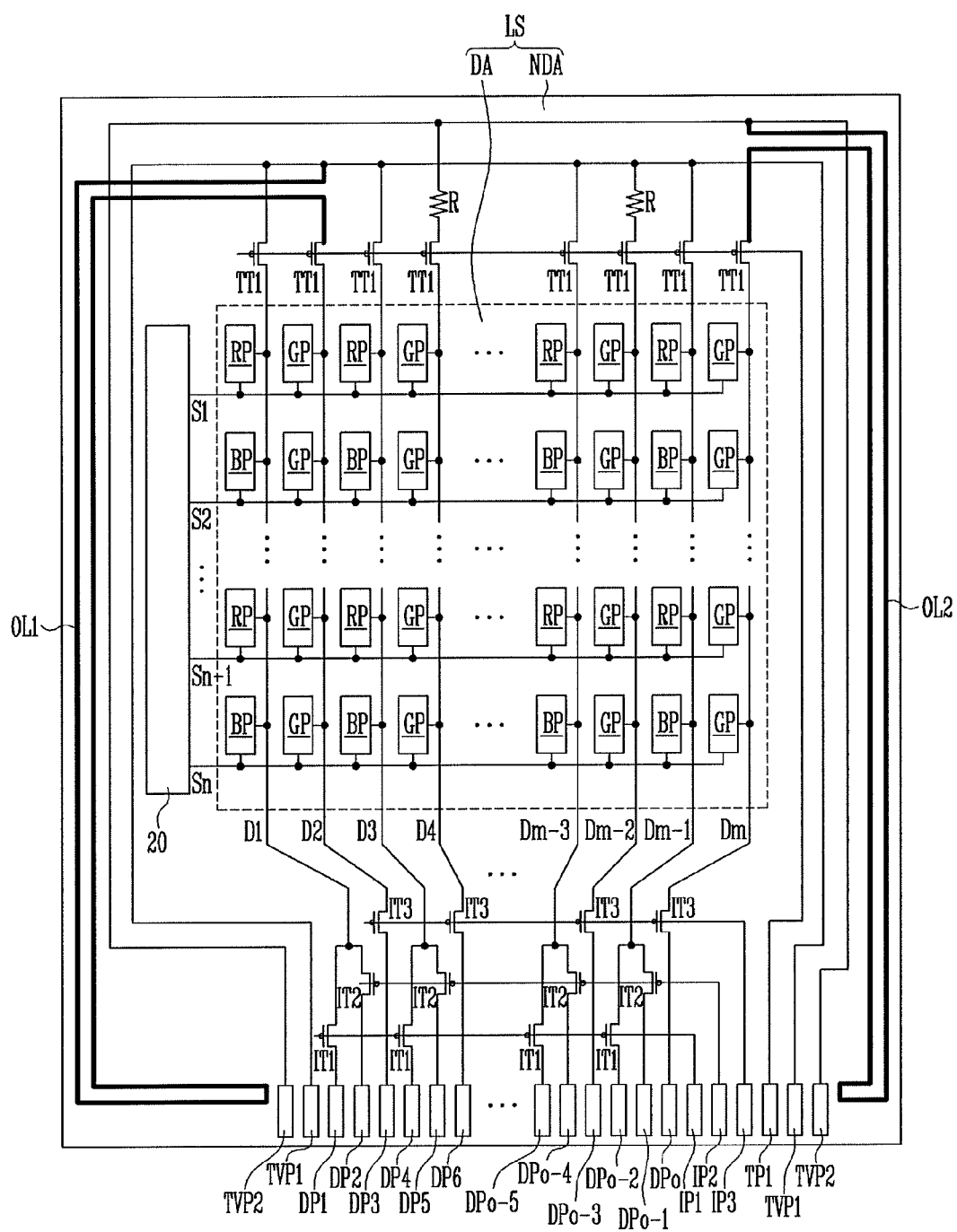

DISPLAY DEVICE AND METHOD OF FABRICATING THE SAME

CROSS-REFERENCE TO RELATED APPLICATION

Korean Patent Application No. 10-2014-0101136, filed on Aug. 6, 2014, and entitled: "Display Device and Method of Fabricating the Same," is incorporated by reference herein in its entirety.

BACKGROUND

1. Field

One or more embodiments described herein relate to a display device and a method for fabricating a display device.

2. Description of the Related Art

Liquid crystal displays, organic light emitting diode displays, electrophoretic displays, and other types of flat panel displays have been developed. These displays have panels with pixels coupled to data lines and scan lines. In operation, driving circuits supply scan signals to the scan lines and data signals to the data lines. The data lines, scan lines, and pixels may be provided on array substrates of the display panels.

When a display panel is hit by debris during manufacturing, cracks may form at various areas including the array substrates. As a result, the data and/or scan lines may be disconnected, or a resistance of the data and/or scan lines may increase. The pixels therefore may emit light inaccurately or not at all.

Recently, flexible displays have been developed. When displays of this type have minute cracks, the cracks may become larger as the displays are bent or become crooked. Often, these minute cracks are not detected before the displays are released to the public. As a result, the pixels may not emit light or may emit light inaccurately.

SUMMARY

In accordance with one embodiment, a display device includes a display area including pixels coupled to data lines and scan lines; a test pad to receive a test signal; a plurality of first test transistors coupled between the data lines of the display area and the test pad; and at least one outline coupled between one of the first test transistors and the test pad, the at least one outline in a non-display area outside the display area. The at least one outline may traverse a path adjacent the display area once.

The first test transistor may be coupled to the at least one outline, the at least one outline may be coupled to a data line, and the data line may be coupled to at least one green pixel or sub-pixel in the display area. The display device may include a resistance between one of the first test transistors that is not coupled to the at least one outline and the test pad. The resistance may be a resistor.

The display device may include a test control pad coupled to control electrodes of the first test transistors; a plurality of initialization transistors coupled between the data lines of the display area and pads to receive initialization signals; and a plurality of initialization control pads coupled to control electrodes of the initialization transistors. The display device may include a plurality of data pads coupled to the data lines. The test pad, the test control pad, the initialization control pads, the data pads, the test transistors, the initialization transistors, and the at least one outline may be in the non-display area.

The test control pad may receive a test control signal that is opposite to an initialization control signal received by one of the initialization control pads. The scan signals may be coupled to the scan lines within a period during which the test control signal is supplied as first gate-on voltage value, and the scan signals may be supplied as second gate-on voltages value.

The display device may include a plurality of first test control pads coupled to control electrodes of the first test transistors; a plurality of initialization transistors coupled between the data lines in the display area and initialization pads to receive initialization signals; a plurality of initialization control pads coupled to control electrodes of the initialization transistors; a second test transistor coupled between one of the data lines and the at least one outline; a second test control pad coupled to a control electrode of the second test transistor; and a plurality of data pads coupled to the data lines.

The first and second test control pads may receive a test control signal opposite to an initialization control signal received by one of the initialization control pads. The scan signals coupled to the scan lines may be supplied as second gate-on voltage value, during a period when the test control signal is supplied as a first gate-on voltage value. The test pad, the first and second test control pads, the initialization control pads, the data pads, the first and second test transistors, the initialization transistors, and the at least one outline may be in the non-display area.

In accordance with another embodiment, a method for manufacturing a display device includes manufacturing an array substrate of a display panel; and inspecting the array substrate of the display panel for a crack.

The manufacturing operation may include forming data lines on the array substrate of the display panel, scan lines crossing the data lines, a plurality of pixels coupled to the data lines and the scan lines, a test pad, a plurality of first test transistors coupled between the data lines of the display area and the test pad, at least one outline coupled between one of the first test transistors and the test pad, the at least one outline in a non-display area, a control pad coupled to control electrodes of the first test transistors, a plurality of initialization transistors coupled between the data lines of a display area and pads to receives initialization signals, and a plurality of initialization control pads coupled to control electrodes of the initialization transistors.

The inspecting operation may include supplying a test signal to the test pad, supplying a test control signal to the test control pad, and supplying initialization control signals to the initialization control pads, wherein the test control signal is opposite to one of the initialization control signals.

The manufacturing may include forming a plurality of data lines on the array substrate of the display panel, a plurality of scan lines crossing the data lines, a plurality of pixels coupled to the data lines and the scan lines, a test pad, a plurality of first test transistors coupled between the data lines of the display area and the test pad, at least one outline coupled between one of the first test transistors and the test pad, the at least one outline in a non-display area, a plurality of first test control pads coupled to control electrodes of the first test transistors, a plurality of initialization transistors coupled between the data lines of a display area and the pads to receive initialization signals, a plurality of initialization control pads coupled to control electrodes of the initialization transistors, a second test transistor coupled between the initialization transistor and the at least one outline; and a second test control pad coupled to a control electrode of the second test transistor.

The inspecting operation may include supplying a test signal to the test control pad, supplying a test control signal to the first and second test control pads; an supplying initialization control signals to the initialization control pads, wherein the test control signal is opposite to one of the initialization control signals.

The method may include performing a module process; and re-inspecting cracks on the display panel after the module process, wherein the performing includes attaching the array substrate to an opposite substrate of the display panel; attaching a flexible film to the array substrate; attaching the flexible film to the source printed circuit board; and coupling a control printed circuit board and the source printed circuit board using a flexible cable.

BRIEF DESCRIPTION OF THE DRAWINGS

Features will become apparent to those of skill in the art by describing in detail exemplary embodiments with reference to the attached drawings in which:

FIG. 8 illustrates another embodiment of an array substrate of a display panel;

DETAILED DESCRIPTION

Figure 1:
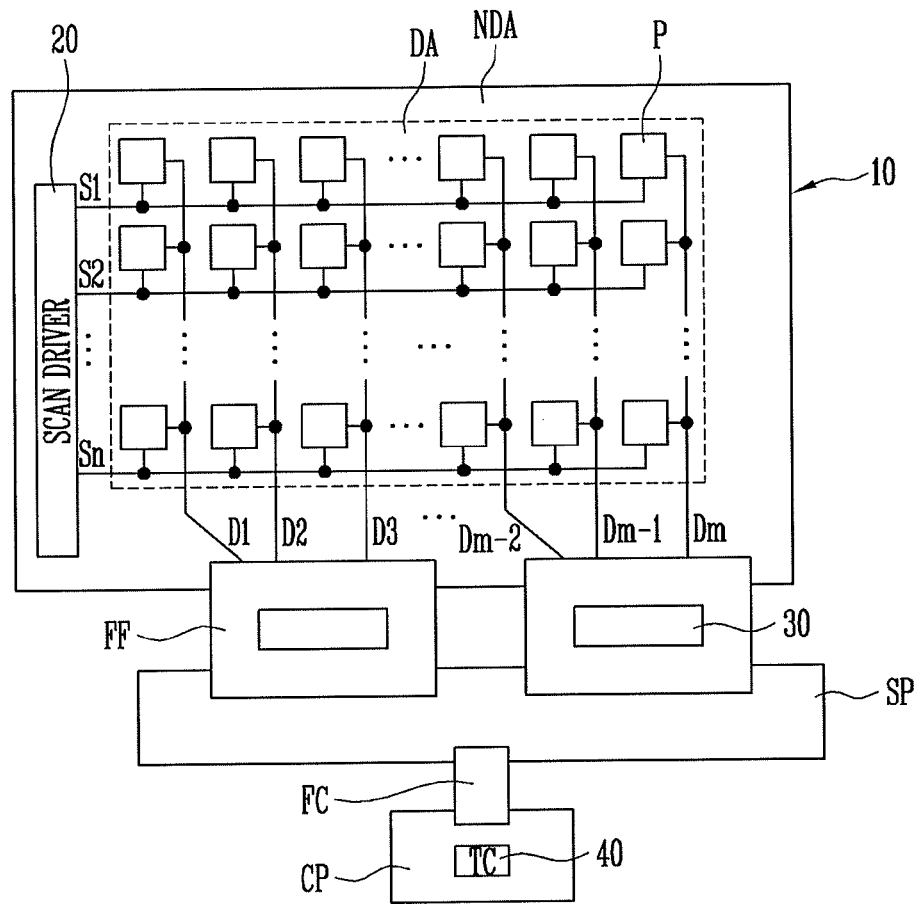
FIG. 1 illustrates an embodiment of a display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a display device which includes a display panel 10, a scan driver 20, a data driver, and a timing controller (TC) 40. The display device may be an organic light emitting display OLED, or another type of display including but not limited to a liquid crystal display, a field emission display, or a plasma display panel.

Data lines D1 to Dm (m≥2) and scan lines S1 to Sn (n≥2) cross each other at the display panel 10. Pixels P arranged in a matrix are located at crossing regions of the data lines D1 to Dm and the scan lines S1 to Sn. The pixels P are in a display area DA of the display panel 10. The pixels P may be pixels or sub-pixels. In the latter case, the sub-pixels may emit light of different colors.

Each of the pixels P are coupled to one scan line and one data line. Each of the pixels P receives a data signal through a corresponding one of the data lines when a san signal is supplied to a respective scan line. Each of the pixels P emit light with a predetermined brightness by controlling current flowing to an organic light emitting diode. The magnitude of the current is based on a voltage value of a supplied data signal.

The scan driver 20 receives a scan timing control signal from the timing controller 40. The scan driver 20 generates scan signals depending on a scan timing control signal SCS. The scan driver 20 supplies scan signals to the scan lines S1 to Sn.

The scan driver 20 is located adjacent one or more sides of the display area DA. The scan driver 20 may be formed concurrently with the data lines D1 to Dm, the scan lines S1 to Sn, and the pixels P using, for example, an amorphous silicon TFT gate driver ASG method or a gate driver in panel GIP method. Alternatively, the scan driver 20 may be mounted on a tape carrier package or a flexible film. The tape carrier package or flexible film on which the scan driver 20 is mounted may be attached to an array substrate of the display panel 10 by a tape automated bonding TAB process. The scan driver 20 may be coupled to gate pads, which are coupled to the scan lines S1 to Sn.

The data driver includes at least one source drive IC 30. The source drive IC 30 receives digital video data signal and a source timing control signal from the timing controller 40. The source drive IC 30 converts digital video data signal into data signals by responding to the source timing control signal. The source drive IC 30 supplies the data signals to the data lines D1 to Dm by being synchronized to each of the scan signals. As a result, the data signals are supplied to the pixels P to which the scan signals are supplied.

The source drive IC 30 may be mounted on the flexible film FF and may be attached to the array substrate of the display panel 10 and a source printed circuit board SP. The source drive IC 30 may be coupled to data pads coupled to the data lines D1 to Dm. Alternatively, the source drive IC 20 may be attached to the array substrate of the display panel 10 and coupled to the data pads using a chip-on-glass process or a chip-on-plastic glass.

The timing controller 40 receives the digital video data and the timing signals. The timing signals may include vertical sync signals, horizontal sync signals, data enable signals, dot clock, and/or other signals. The timing controller 40 generates timing control signals for controlling operation timing of the data driver and the scan driver 30 based on the timing signals. The timing control signals may include scan timing control signals for controlling operation timing of the scan driver 20 and data timing control signals for controlling operation timing of the data driver. The timing controller 40 outputs the scan timing control signals to the scan driver 20 and outputs data timing control signals and digital video data to the data driver.

The timing controller 40 may be mounted on a control printed circuit board CP. The control printed circuit board CP and the source printed circuit board SP may be coupled to each other through a flexible cable FC, such as a flexible flat cable FFC or a flexible printed circuit FPC.

A power supply source may supply not only driving signals to the scan driver 20, the data driver 30, and the timing controller 40, but also a first power signal through a first power voltage line and a second power signal through a second power voltage line. The first power signal may be supplied to the pixels P through the first power voltage line coupled to the pixels P. The second power signal may be supplied to the pixels P through the second power voltage line coupled to cathode electrodes of the organic light emitting diodes of the pixels P. A voltage value of the first power signal may be set to a predetermined (e.g., high) voltage value and a voltage value of the second power signal may be set to a predetermined (e.g., low) voltage value.

Figure 2:
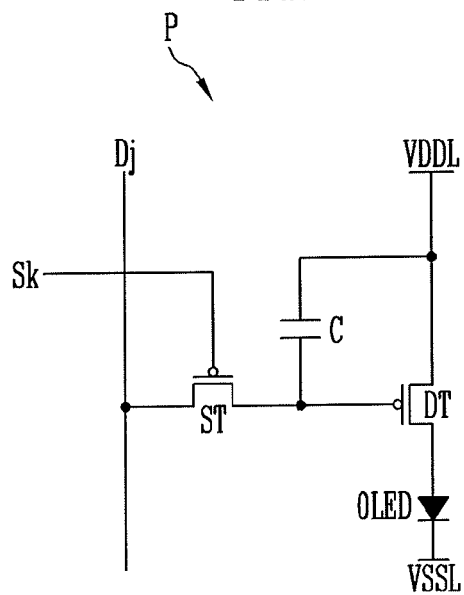
FIG. 2 illustrates an embodiment of a pixel.

FIG. 2 illustrates an example of a pixel, which, for example, may be any of the pixels P in FIG. 1. Referring to FIG. 2, the pixels P may be coupled to a k-th ($1 \leq k \leq n$) scan line Sk, a j-th ($1 \leq j \leq m$) data line Dj, a first power voltage line VDDL, and a second power voltage line VSSL. The pixels P may also include a driving transistor DT, an organic light emitting diode OLED, a scan transistor ST, and a capacitor C.

The driving transistor DT is between the organic light emitting diode OLED and the first power voltage line VDDL, and controls an amount of a current flowing to the organic light emitting diode OLED. Since an amount of a current flowing in a channel of the driving transistor DT may change depending on the voltage value of the data signal supplied to a control electrode of the driving transistor DT, the amount of the current flowing to the organic light emitting diode OLED may be controlled as the voltage value of the data signal supplied to a gate electrode of the driving transistor DT is controlled.

The control electrode of the driving transistor DT is coupled to a second electrode of the scan transistor ST, the first electrode is coupled to the first power voltage line VDDL, and the second electrode is coupled to an anode electrode of the organic light emitting diode OLED. In one embodiment, the control electrode is a gate electrode, the first electrode is a source electrode or a drain electrode, and the second electrode is an electrode different from the first electrode. For example, when the first electrode is a source electrode, the second electrode is a drain electrode, or vice versa.

The organic light emitting diode OLED may emit light depending on the current between the drain and the source of the driving transistor DT. The organic light emitting diode OLED has a anode electrode coupled to the second electrode of the driving transistor DT and a cathode electrode coupled to the second power voltage line VSSL.

The scan transistor ST is coupled between the gate electrode of the driving transistor DT and the j-th data line Dj. The scan transistor ST is turned on by a scan signal of the k-th scan line SLk and supplies a data signal of the j-th data line Dj to the gate electrode of the driving transistor DT. The gate electrode of the scan transistor ST is coupled to a k-th scan line SLk, the first electrode is coupled to the j-th data line Dj, and the second electrode is coupled to the gate electrode of the driving transistor DT.

The capacitor C is between the gate electrode of the driving transistor DT and the first power voltage line VDDL. The capacitor C maintains the data signal supplied to the gate electrode of the driving transistor DT for an amount of time.

Figure 3:
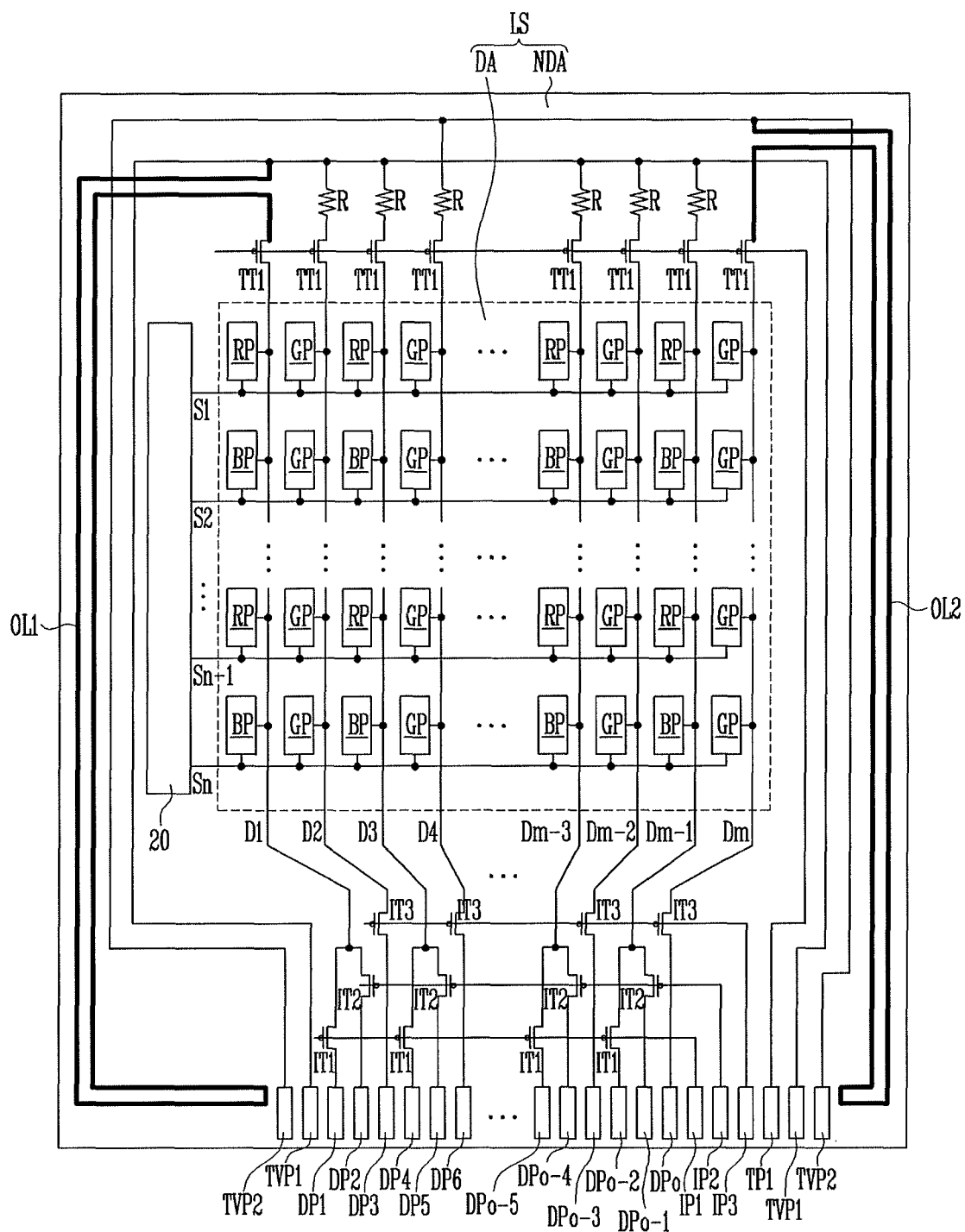
FIG. 3 illustrates an embodiment of an array substrate of a display panel.

Each of semiconductor layers of the driving transistor DT and the scan transistor ST may include polysilicon, a-Si, an oxide semiconductor, or another material. In FIG. 3, the driving transistor DT and the scan transistor ST are P-type transistors. In another embodiment, n-type transistors may be used.

The pixels P may include a compensating circuit to compensate a threshold voltage value of the driving transistor DT. The compensating circuit may include at least one transistor, and may sense the threshold voltage value of the driving transistor DT and reflect it to the gate electrode. Therefore, a current Ids between the drain and the source of the driving transistor DT may not depend on the threshold voltage value Vth of the driving transistor DT. The pixels in FIG. 1 may have a structure different from the one in FIG. 2 in other embodiments.

FIG. 3 illustrates an embodiment of an array substrate of a display panel, which, for example, may be the display panel 10 in FIG. 1. Referring to FIG. 3, the display panel 10 includes an array substrate LS and an opposite substrate. The array substrate LS includes the display area DA and a non-display area NDA. The display area DA displays includes pixels RP, GP, and BP for generating light of an image. The non-display area NDA is outside the display area DA.

The pixels RP, GP and BP in the display area DA of the array substrate LS may be arranged in a matrix at crossing regions of the data lines D1 to Dm and the scan lines S1 to Sn. Each of the pixels RP, GP and BP is coupled to one scan line and one data line. Although red and blue pixels RP and BP are illustrated in FIG. 3 as being coupled to odd data lines and green pixels GP are illustrated as being coupled to even data lines, the coupling arrangement of the pixels P may be different in other embodiments.

Data pads DP1 to DPo (o>m), initialization control pads IP1, IP2 and IP3, a first test control pad TP1, test pads TVP1 and TVP2, initialization transistors IT1, IT2 and IT3, first test transistors TT1, resistance R, and outlines OL1 and OL2 are in the non-display area NDA of the array substrate LS. When the scan driver 20 is formed using the ASG method or the GIP method, the scan driver 20 may be in the non-display area NDA adjacent one side of the display area DA.

The data pads DP1 to DPo are coupled to the data lines D1 to Dm through the initialization transistors IT1, IT2 and IT3. In order to inspect cracks of the array substrate LS, initialization signals may be supplied to the data pads DP1 to DPo. The source drive IC 30 may be attached to a completed display panel 10 as shown in FIG. 1. Here, the data pads DP1 to DPo may be attached to the source drive IC 30, e.g., data signals may be supplied to the data lines D1 to Dm of the completed display panel 10 as the data signals are supplied to the data pads DP1 to DPo.

The initialization control pads IP1, IP2 and IP3 may include three (3) initialization control pads as shown in FIG. 3. The initialization transistors IT1, IT2 and IT3 may include three (3) initialization transistors. The first initialization control pad IP1 may be coupled to control electrodes of the first initialization transistors IT1. The second initialization control pad IP2 may be coupled to control electrodes of the second initialization transistors IT2. The third initialization control pad IP3 may be coupled to control electrodes of the third initialization transistors IT3. The first initialization control signal may be supplied to the first initialization control pad IP1. The second initialization control signal may be supplied to the second initialization control pad IP2. The third initialization control signal may be supplied to the third initialization control pad IP3.

The first test control pad TP1 may be coupled to each control electrode of the first test transistors TT1. The test control signal may be supplied to the first test control pad TP1.

The test pads TVP1 and TVP2 may be coupled to the first electrodes of the first test transistors TT1. The test signal(s) may be supplied to the test pads TVP1 and TVP2. A same voltage value of the test signal, or different voltage value of the test signals, may be supplied to the first and second test pads TVP1 and TVP2. For example, a same voltage value of the test signal may be supplied to the first and second test pads TVP1 and TVP2. Also, the first test signal may be supplied to the first test pad TVP1, and the second test signal may be supplied to the second test pad TVP2.

The initialization transistors IT1, IT2 and IT3 may be coupled between the data lines D1 to Dm and the data pads DP1 to DPo. The control electrodes of the first initialization transistors IT1 may be coupled to the first initialization control pad IP1. The control electrodes of the second initialization transistors IT2 may be coupled to the second initialization control pad IP2. The control electrodes of the third initialization transistors IT3 may be coupled to the third initialization control pad IP3.

Each control electrode of the first initialization transistors IT1 may be coupled to the first initialization control pad IP1. The first electrode may be coupled to any one of the data lines D1 to Dm. The second electrode may be coupled to any one of the data pads DP1 to DPo. Each control electrode of the second initialization transistors IT2 may be coupled to the second initialization control pad IP2. The first electrode may be coupled to any one of the data lines D1 to Dm. The second electrode may be coupled to any one of the data pads DP1 to DPo. Each control electrode of the third initialization transistors IT3 may be coupled to the third initialization control pad IP3. The first electrode may be coupled to any one of the data lines D1 to Dm. The second electrode may be coupled to any one of the data pads DP1 to DPo.

The first and second initialization transistors IT1 and IT2 coupled to adjacent data pads may be coupled to one data line. The third initialization transistor IT3 adjacent to the first and second initialization transistors IT1 and IT2 may be coupled to a different data line. For example, the first initialization transistor IT1 coupled to the first data pad DP1 and the second initialization transistor IT2 coupled to the second data pad DP2 may be coupled to the first data line D1. The third initialization transistor IT3 coupled to the third data pad DP3 may be coupled to the second data line D2.

The first test transistors TT1 may be coupled between the data lines D1 to Dm and the test pads TVP1 and TVP2. The control electrodes of the first test transistors TT1 may be coupled to the first test control pad TP1. For example, each control electrode of the first test transistors TT1 may be coupled to the first test control pad TP1. The first electrode may be coupled to any one of the test pads TVP1 and TVP2. The second electrode may be coupled to any one of the data lines D1 to Dm.

The outline may be between the first electrode of the first test transistor TT1 and the test pad. For example, as shown in FIG. 3, a first outline OL1 may be between the first electrode of the first test transistor TT1 coupled to the first data line D1 and the first test pad TVP1. A second outline OL2 may be between the first electrode of the first test transistor TT1 coupled to a m-th data line Dm and the second test pad TVP2. That is, the first outline OL1 may be coupled between the first electrode of the first test transistor TT1 coupled to the first data line D1 and the first test pad TVP1. The second outline OL2 may be coupled between the first electrode of the first test transistor TT1 coupled to the m-th data line Dm and the second test pad TVP2.

Each of the outlines OL1 and OL2 may be outside the display area DA. For example, the first outline OL1 may be adjacent a left side of the display area DA, and the second outline OL2 may adjacent a right side of the display area DA. Also, when the scan driver 20 is in the non-display area DA adjacent one side of the display area DA, the outlines OL1 and OL2 may be further outside than the scan driver 20. Also, the outlines Ol1 and OL2 may be on the outermost side, among the structures formed at the array substrate LS, to surround the structures formed at the array substrate LS. Here, the structures at the array substrate LS may refer to any structure other than the pads.

Particularly, each of the outlines OL1 and OL2 may be adjacent and go at least partially around the outside of the display area DA once. For example, the first outline OL1 may be adjacent and go at least partially around the outside on the left side of the display area DA once, and the second outline OL2 may be adjacent go at least partially around the outside of the right side of the display area DA once.

A voltage value difference between the test signal supplied to the first test transistors TT1 (via the outlines OL1 and OL2 from the test pads TVP1 and TVP2) and the test signal supplied to the first test transistors TT1 (without passing through the outlines OL1 and OL2 from the test pads TVP1 and TVP2) may occur due to wire resistance on the outlines OL1 and OL2.

To prevent the voltage value difference, resistances R may be located between the first electrodes of the first test transistors TT1 not coupled to the outlines OL1 and OL2 and the test pads TVP1 and TVP2. As a result, the voltage value difference in test signal due to wire resistance of the outlines may be reduced or minimized. For example, a resistance value of the first outline OL1, a resistance value of the second outline OL2, and a resistance value of the resistance R may be set in substantially the same in order to reduce the voltage value difference in test signal due to each wire resistance of the outlines OL1 and OL2.

In the array substrate LS in the embodiment of FIG. 3, the first test transistors TT1 and the resistances R are illustrated in an upper non-display area NDA. The data pads DP1 to DPo, the initialization control pads IP1, IP2 and IP3, the first test control pad TP1, the test pads TVP1 and TVP2, and the initialization transistors IT1, IT2 and IT3 are in a lower non-display area NDA. However, the arrangement of the data pads DP1 to DPo, the initialization control pads IP1, IP2 and IP3, the first test control pad TP1, and the test pads TVP1 and TVP2 may be different in other embodiments.

Figure 4:
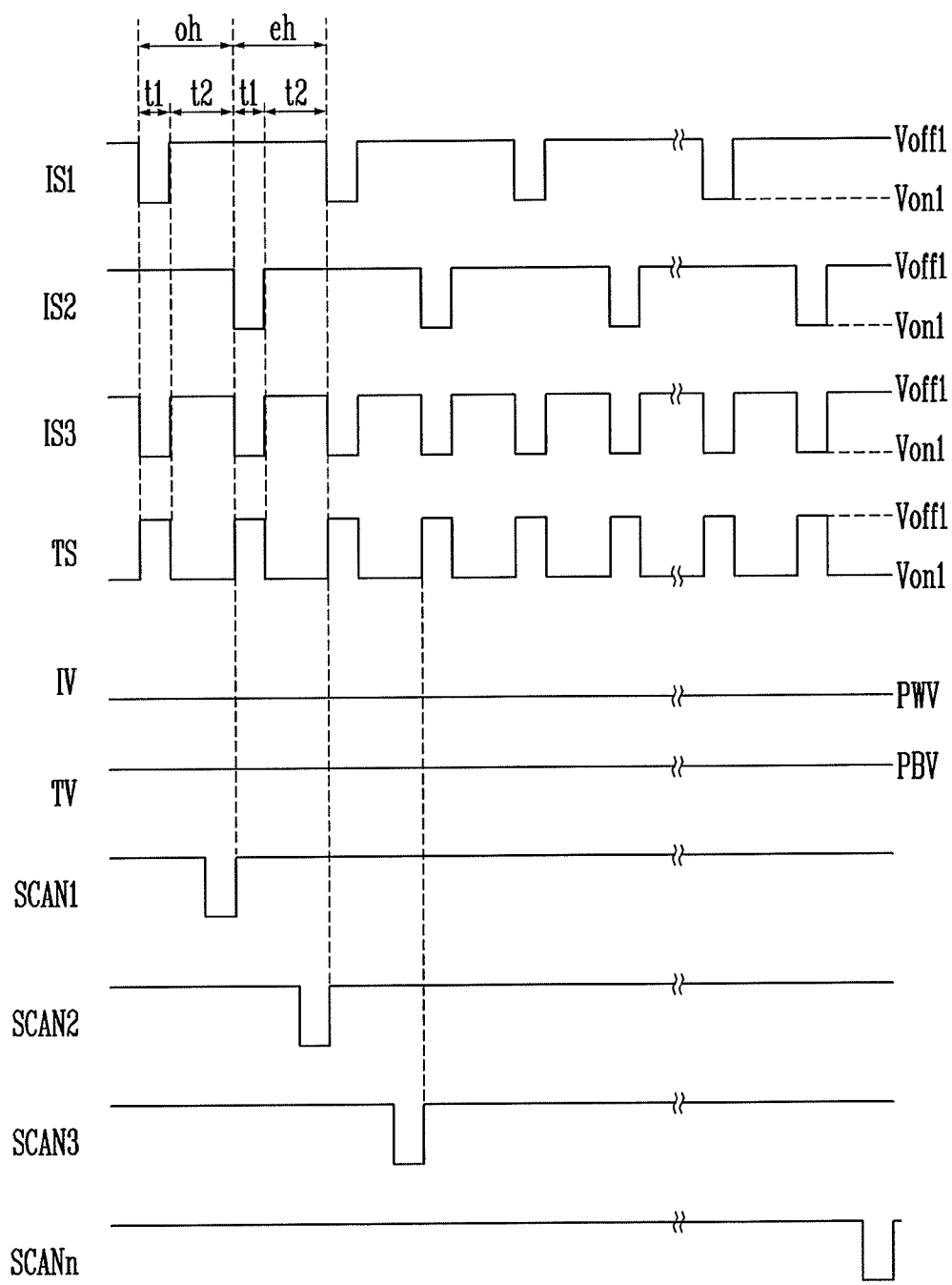
FIG. 4 illustrates an example of signals for the display panel.

FIG. 4 illustrates examples of signals for controlling the display panel in FIG. 3. Initialization control signals IS1, IS2 and IS3 supplied to initialization control pads IP1, IP2, and IP3, test control signal TS supplied to the first test control pad TP1, initialization signal IV supplied to data pad DP1 to DPo, the test signal TV supplied to the test pads TVP1 and TVP2, and first to third and n-th scan signals SCAN1, SCAN2, SCAN3, and SCANn are shown in FIG. 4.

Referring to FIG. 4, a first frame period includes a plurality of horizontal periods, a first horizontal period including the first period T1 and the second period t2. The first frame period is a period when data signals are supplied to all pixels of the display panel 10. The first horizontal period is a period when data signals are supplied to pixels coupled to one scan line.

The first initialization control signal IS1 has a first gate on voltage value Von1 during the first period t1 of the horizontal period oh, and has a first gate off voltage value Voff1 during the second period t2 of the odd horizontal periods oh and the even horizontal periods eh. The second initialization control signal IS2 has the first gate on voltage value Von1 during the first period t1 of the even horizontal period eh, and has the first gate off voltage value Voff1 during the odd horizontal period oh and the second period t2 of the even horizontal period eh. The third initialization control signal IS3 has the first gate on voltage value Von1 during the first period t1 of each horizontal period, and has the first gate off voltage value Voff1 during the second period t2.

The test control signal TS has the first gate off voltage value Voff1 during the first period t1 of each horizontal period, and has the first gate on voltage value Von1 during the second period t2. When the initialization transistors IT1, IT2, and IT3 and the first test transistor TT1 are P-type transistors as shown in FIG. 3, the first gate on voltage value Von1 is lower than the first gate off voltage value Voff1. For example, as shown in FIG. 4, the test control signal TS is opposite to the third initialization control signal IS3.

The initialization signal IV may be set to a peak white gray level voltage value PWV, and the test signal TV may be set to a peak black gray level voltage value PBV. When the driving transistor DT is a P-type transistor as shown in FIG. 2, the peak white gray level voltage value PWV may be lower than the peak black gray level voltage value PBV as shown in FIG. 4. In FIG. 4, an example of the initialization signal IV and the test signal TV are shown. The initialization signal IV and the test signal TV may have different voltage value in other embodiments.

The first to third and n-th scan signals SCAN1, SCAN2, SCAN3, and SCANn have the second gate off voltage value Voff2 during the first period t1 of each horizontal period, and have the second gate on voltage value Von2 during the second period t2. In FIG. 4, an example is shown where first to third and n-th scan signals SCAN1, SCAN2, SCAN3, and SCANn have the second gate on voltage value Von2 during a period shorter than the second period t2 within the second period t2 of each horizontal period, but the present invention is not limited thereto. For example, the first to third and n-th scan signals SCAN1, SCAN2, SCAN3, and SCANn may have the second gate on voltage value Von2 during the second period t2 of each horizontal period. When the scan transistor ST is a P-type transistor as shown in FIG. 2, the second gate on voltage value Von2 may be lower than the second gate off voltage value Voff2 as shown in FIG. 4.

When the scan transistors ST of the pixels RP, GP, and BP have the same transistor characteristics as the first to third initialization transistors IT1, IT2, and IT3 and the first test transistors TT1, the second gate on voltage value Von2 may have substantially same as the first gate on voltage value Von1, and the second gate off voltage value Voff2 may have substantially same as the first gate off voltage value Voff1.

FIGS. 3 and 4 illustrate operations in an embodiment of a method for inspecting a display panel for cracks. The first initialization control signal IS1 and the third initialization control signal IS3 have the first gate on voltage value Von1 during the first period t1 of the odd horizontal periods oh. The second initialization control signal IS2 and the test control signal TS have the first gate off voltage value Voff1. Therefore, the first initialization transistors IT1 and the third initialization transistors IT3 are turned on, and the second initialization transistors IT2 and the first test transistors TT1 are turned off. Thus, the initialization signal IV may be supplied to the first to m-th data lines D1 to Dm through the first and third initialization transistors IT1 and IT3.

The first to third initialization control signals IS1, IS2 and IS3 have the first gate off voltage value Voff1 and the test control signal TS have the first gate on voltage value Von1 during the second period t2 of odd horizontal period oh. Therefore, the first to third initialization transistors IT1, IT2, and IT3 are turned off and the first test transistors TT1 are turned on. Accordingly, the test signal TV may be supplied to the first to m-th data lines D1 to Dm through the first test transistors TT1.

Also, when the first scan signal SCAN1 has the second gate on voltage value Von2 within the second period t2 of the odd horizontal period oh, signals of the first to m-th data lines D1 to Dm are supplied to the red and green pixels RP and GP coupled to the first scan line S1.

Figure 5A:
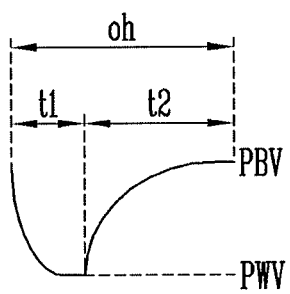
FIGS. 5A-5C illustrate examples of a signals for controlling the pixel.

When a voltage value of the initialization signal IV is the peak white gray level voltage value PWV and a voltage value of the test signal TV is the peak black gray level voltage value PBV, the voltage value to be supplied to the pixels may decrease to the peak white gray level voltage value PWV during the first period t1 and increase to the peak black gray level voltage value PBV during the second period t2 as shown in FIG. 5A. However, if there are cracks on the array substrate LS, the data lines D1 to Dm or the outlines OL1 and OL2 may be disconnected or wire resistance of the data lines D1 to Dm or the outlines OL1 and OL2 may increase.

Figure 5B:
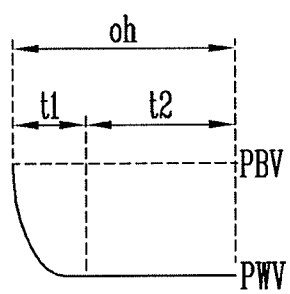

For example, when there are one or more cracks on the array substrate LS and the data lines D1 to Dm or the outlines OL1 and OL2 are disconnected, the peak black gray level voltage value PBV may not be supplied during the second period t2. Therefore, the voltage value to be supplied to the pixel may decrease to the peak white gray level voltage value PWV during the first period t1, and the peak white gray level voltage value PWV may be maintained during the second period t2, as shown in FIG. 5B. Since the pixels coupled to the disconnected data line or outline due to cracks may express peak white gray level, a bright line may show.

Figure 5C:
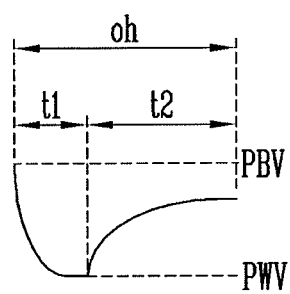

In addition, when there are one or more cracks on the array substrate LS and wire resistance of the data lines D1 to Dm or the outlines OL1 and OL2 increase, even if the peak black gray level voltage value PBV is supplied during the second period t2, the voltage value to be supplied to the pixel will not decrease to the peak white gray level voltage value PWV during the first period t1 and increase to the peak black gray level voltage value PBV during the second period t2 as shown in FIG. 5C. As a result, the pixels coupled to the data line or outline where wire resistance increased due to cracks will express gray gradation, and therefore a less bright line may show.

As discussed above, according to one embodiment, the initialization signal IV may be supplied via the initialization transistors IT1, IT2, and IT3 during the first period t1 of every horizontal period. The test signal TV may be supplied through the first test transistors TT1 during the second period t2. Therefore, based on disconnection or change in wire resistance of the data lines D1 to Dm, or disconnection or change in wire resistance of the outline outside the display area DA, a determination may be made as to whether cracks exist on the array substrate LS. For example, when a bright line or a less bright line shows, it may be determined that cracks are on the array substrate LS.

Figure 6:
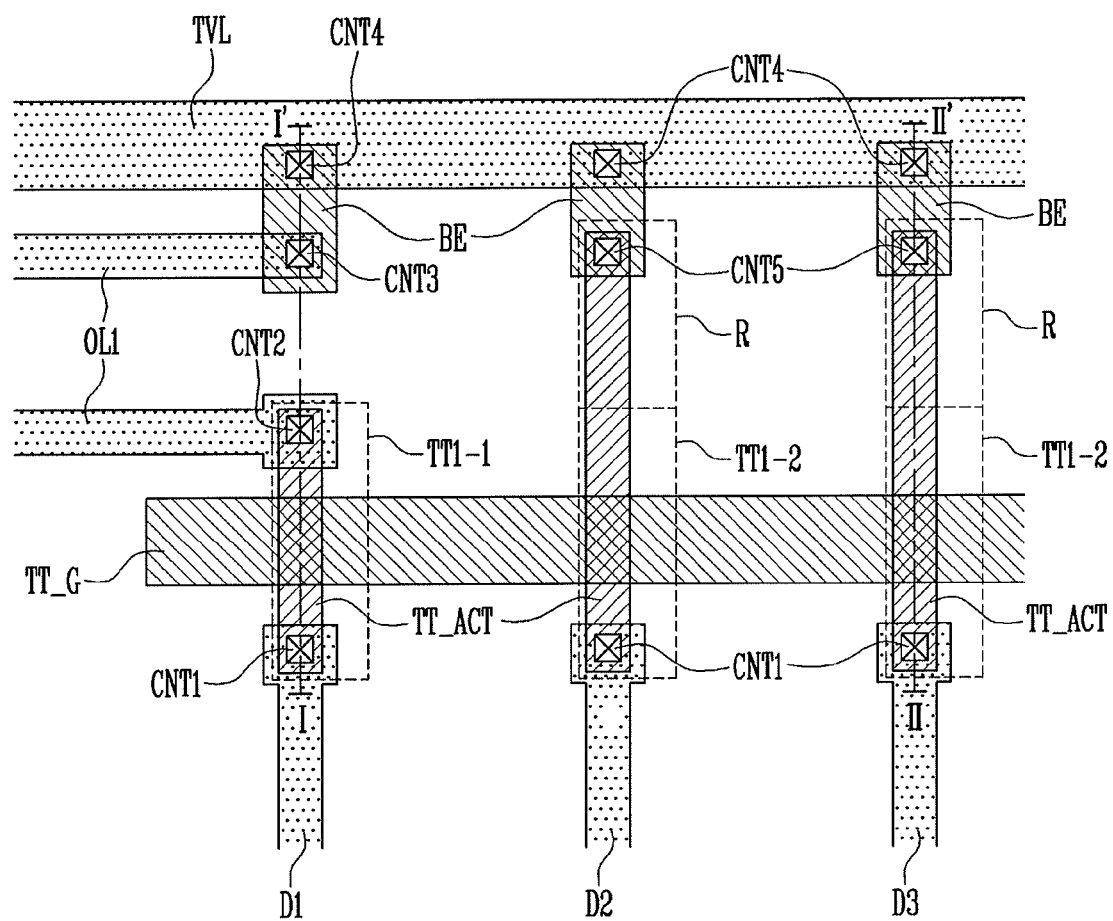
FIG. 6 illustrates an embodiment of a coupling structure between a test transistor and an outline and the test transistor and the resistance in FIG. 3.
Figure 7A:
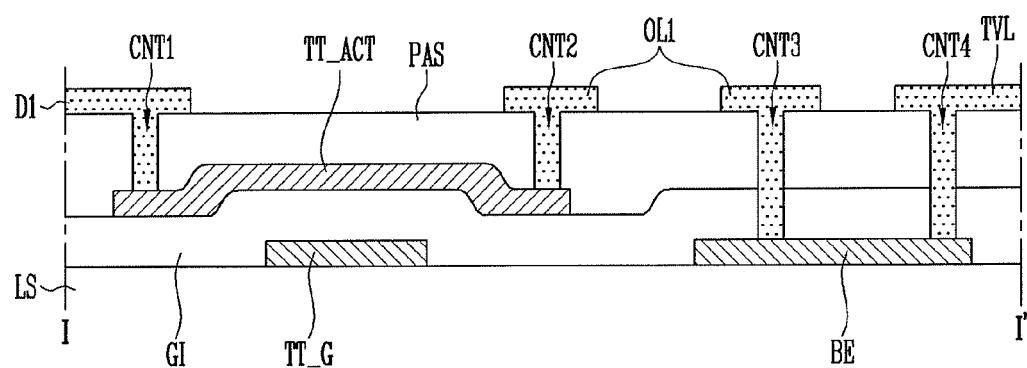
FIG. 7A illustrates a view taken along section line I-I' in FIG. 6.
Figure 7B:
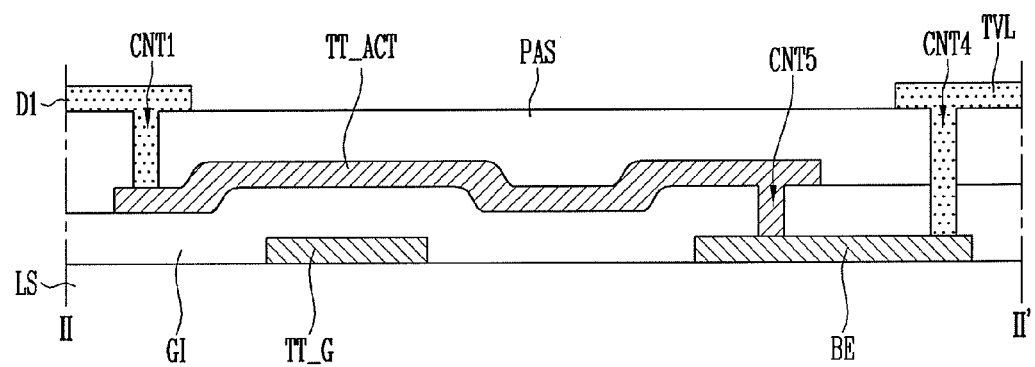
FIG. 7B illustrates a view taken along section line II-II' in FIG. 6.

FIG. 6 illustrates an embodiment of a coupling structure between the test transistor and the outline and the test transistor and the resistance in FIG. 3. FIG. 7A is a cross-sectional view along line I-I' in FIG. 6. FIG. 7B is a cross-sectional view along line II-II' in FIG. 6. The coupling structure of the first test transistor TT1 coupled to the first data line D1 and the first outline OL1 and the coupling structure of the first test transistors TT1 coupled to the second and third data lines and the resistance R are described below in reference to FIGS. 6, 7A, and 7B. For purposes of convenience, FIG. 6 shows only the first to third data lines D1, D2, and D3 and the first test transistors TT1 coupled to the first to third data lines D1, D2, and D3.

In FIG. 6, the first transistor TT1 coupled to the first outline OL1 is defined as a (1-1)-th test transistor TT1-1, and the first test transistor TT1 coupled to the resistance R as a 1-2 test transistor TT1-2.

Referring to FIGS. 6 and 7A, a control electrode TT_G of the (1-1)-th test transistor TT1-1 overlaps an active layer TT_ACT in a preset region. One end of the active layer TT_ACT of the (1-1)-th test transistor TT1-1 may be coupled to the first data line D1 through a first contact hole CNT1, and the other end of the active layer TT_ACT may be coupled to one end of the first outline OL1 through a second contact hole CNT2. The first outline OL1 may be adjacent and go at least partially around the display area DA once as shown in FIG. 3. The other end of the first outline OL1 may be coupled to a bridge electrode BE via a third contact hole CNT3. The bridge electrode BE may be coupled to a test voltage line TVL through a fourth contact hole CNT4. The test voltage line TVL may be a line coupled to any one of the test pads TVP1 and TVP2 to which the test signal TV is supplied.

The control electrode TT_G of the (1-1)-th test transistor TT1-1 and the bridge electrode BE may include a first metal pattern. The active layer TT_ACT of the (1-1)-th test transistor TT1-1 may include a semiconductor pattern. The first data line D1, the first outline OL1, and the test voltage line TVL may include a second metal pattern. The first metal pattern may be a gate metal pattern, and the second metal pattern may be a source/drain metal pattern. The semiconductor pattern may include, for example, polysilicon, single crystal silicon, amorphous silicon, or an oxide semiconductor material. A gate insulator GI may be between the first metal pattern and the semiconductor pattern to insulate the first metal pattern and the semiconductor pattern. Also, in order to insulate the semiconductor pattern and the second metal pattern, a passivation layer PAS may be between the semiconductor pattern and the second metal pattern.

Referring to FIGS. 6 and 7B, the control electrode TT_G of the (1-2)-th test transistor TT1-2 may overlap the active layer TT_ACT in a preset region. One end of the active layer TT_ACT of the (1-2)-th test transistor TT1-2 may be coupled to the second or third data line D2 or D3 via the first contact hole CNT1, and the other end of the active layer TT_ACT may be coupled to the bridge electrode through a fifth contact hole CNT5. The bridge electrode BE may be coupled to the test voltage line TVL via a fourth contact hole CNT4.

The control electrode TT_G of the (1-2)-th test transistor TT1-2 and the bridge electrode BE may include the first metal pattern. The active layer TT_ACT of the (1-2)-th test transistor TT1-2 may the semiconductor pattern. The second and third data lines D2 and D3 and the test voltage line TVL may include the second metal pattern. The first metal pattern may be a gate metal pattern, and the second metal pattern may be the source/drain metal pattern. The semiconductor pattern may include, for example, polysilicon, single crystal silicon, amorphous silicon, or an oxide semiconductor material. The gate insulator GI may be between the first metal pattern and the semiconductor pattern to insulate the first metal pattern and the semiconductor pattern. Also, in order to insulate the semiconductor pattern and the second metal pattern, a passivation layer PAS may be between the semiconductor pattern and the second metal pattern.

The active layer TT_ACT of the 1-2 test transistor TT1-2 may be longer than the active layer TT_ACT of the (1-1)-th test transistor TT1-1. For example, the active layer TT_ACT of the 1-2 test transistor TT1-2 may be longer than the active layer TT_ACT of the (1-1)-th test transistor TT1-1 and may act as the resistance R. For example, the active layer TT_ACT of the (1-1)-th test transistor TT1-1 into which impurities are doped may function as the resistance R. By designing the resistance value of the resistance R as substantially the same as the wire resistance value of the first outline OL1, the voltage value difference in test signal due to wire resistance of the first outline OL1 may be minimized.

FIG. 8 illustrates another embodiment of an array substrate of display panel 10. Referring to FIG. 8, the display panel 10 includes the array substrate LS and the opposite substrate. The array substrate LS is divided into the display area DA which includes pixels P for displays images, and a non-display area NDA outside the display area DA.

The pixels P are in the display area DA of the array substrate LS. The data pads DP1 to DPo, the initialization control pads IP1, IP2, and IP3, the first test control pad TP1, the test pads TVP1 and TVP2, the initialization transistors IT1, IT2, and IT3, the first test transistors TT1, the resistances R, and the outlines OL1 and OL2 are in the non-display area DA of the array substrate LS.

The pixels P of the array substrate LS, the data pads DP1 to DPo, the initialization control pads IP1, IP2, and IP3, the first test control pad TP1, the test pads TVP1 and TVP2, the initialization transistors IT1, IT2, and IT3, the first test transistors TT1, the resistances R, and the outlines OL1 and OL2 of the display panel 10 in FIG. 8 may be substantially the same as in FIG. 3.

The outlines OL1 and OL2 of the array substrate LS of the display panel 10 are coupled to the data lines D2 and Dm coupled to the green pixels GP through the first test transistors TT1. For example, the first test transistor TT1 coupled to the outline may be coupled to the data line that is coupled to the green pixels GP. Since human color perception capability for green color is better than for red or blue color, the cracks in the non-display area NDA may be more easily determined because less bright lines are more easily perceived according to the embodiment in FIG. 8.

When the outlines OL1 and OL2 are coupled to the data lines D2 and Dm that are coupled to the green pixels GP through the first test transistor TT1, the resistances R may be coupled only to the first test transistors TT1, which are coupled to the data lines coupled to the green pixels GP among the first test transistors TT1 that are not coupled to the outlines OL1 and OL2. As a result, the embodiment in FIG. 8 may reduce more resistances R than the embodiment in FIG. 3. Thus, there may be less circuit complexity in the embodiment of FIG. 8.

Figure 9:
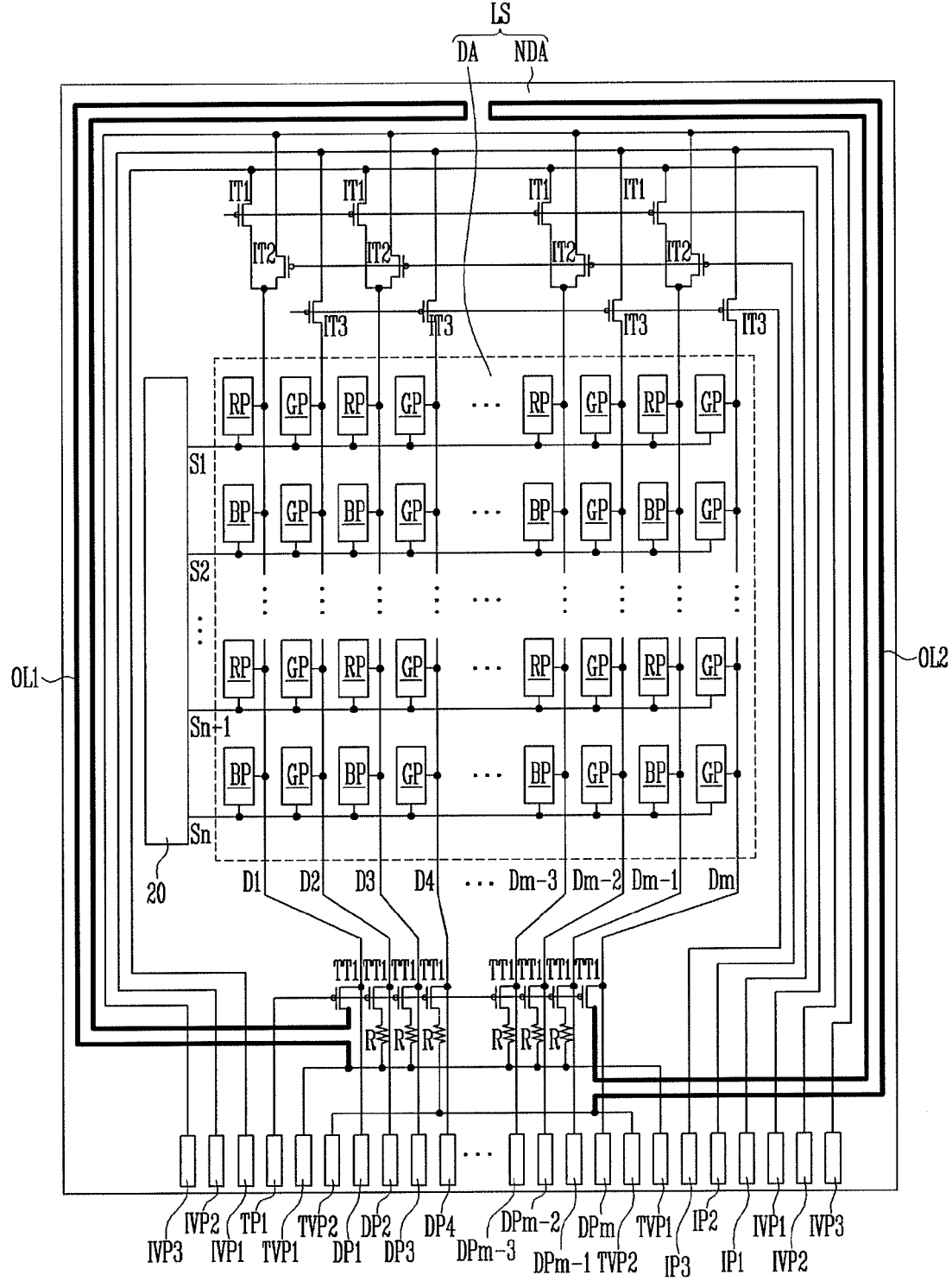
FIG. 9 illustrates another embodiment of an array substrate of a display panel.

FIG. 9 illustrates another embodiment of an array substrate of the display panel 10. Referring to FIG. 9, the display panel 10 includes the array substrate LS and the opposite substrate. The array substrate LS is divided into the display area DA including pixels P to display and the non-display area NDA outside the display area DA. The pixels P are in the display area DA of the array substrate LS.

The pixels P of the array substrate LS of the display panel 10 according to the embodiment in FIG. 9 may be substantially the same as the embodiment in FIG. 3

The data pads DP1 to DPm, the initialization control pads IP1, IP2, and IP3, the initialization pads IVP1, IVP2, and IVP3, first test control pad TP1, the test pads TVP1 and TVP2, the initialization transistors IT1, IT2, and IT3, the first test transistors TT1, the resistances R, and the outlines OL1 and OL2 are in the non-display area DA of the array substrate LS. Also, when the scan driver 20 is formed using the ASG method or the GIP method, the scan driver 20 may be in the non-display area NDA outside the display area DA.

The data pads DP1 to DPm may be coupled to the data lines D1 to Dm. When inspecting cracks of the array substrate LS, no signal or power may be supplied to the data pads DP1 to DPm. The source drive IC 30 may be attached to the completed display panel 10 as shown in FIG. 1. The data pads DP1 to DPm may be coupled to the source drive IC 30. For example, since the source drive IC 30 supplies data signals to the data pads DP1 to DPm, the source drive IC 30 may supply data signals to the data lines D1 to Dm of the completed display panel 10.

The initialization pads IVP1, IVP2, and IVP3 are coupled to the data lines D1 to Dm through the first test transistors TT1. The initialization signals are supplied to the initialization pads IVP1, IVP2, and IVP3. Same or different voltage value of the initialization signals may be supplied to the initialization pads IVP1, IVP2, and IVP3. For example, same voltage value of the initialization signals may be supplied to the first to third initialization pads IVP1, IVP2, and IVP3. Alternatively, the first voltage value of the initialization signal may be supplied to the first initialization pad IVP1, the second voltage value of the initialization signal may be supplied to the second initialization pad IVp2, and the third voltage value of the initialization signal may be supplied to the third initialization pad IVP3.

As shown in FIG. 9, the initialization control pads IP1, IP2, and IP3 include three (3) initialization control pads, and the initialization transistors IT1, IT2, and IT3 include three (3) initialization transistors. The first initialization control pad IP1 is coupled to control electrodes of the first initialization transistors IT1. The second initialization control pad IP2 is coupled to control electrodes of the second initialization transistors IT2. The third initialization control pad IP3 is coupled to control electrodes of the third initialization transistors IT3. The first initialization control signal is supplied to the first initialization control pad IP1, the second initialization control signal is supplied to the second initialization control pad IP2, and the third initialization control signal is supplied to the third initialization control pad IP3.

The first test control pad TP1 is coupled to each control electrode of the first test transistors TT1. The test control signal is supplied to the first test control pad TP1.

The test pads TVP1 and TVP2 are coupled to first electrodes of the first test transistors TT1. The test signals are supplied to the test pads TVP1 and TVP2. Same or different test signals are supplied to the first and second test pads TVP1 and TVP2. For example, same test signals may be supplied to the first and second test pads TVP1 and TVP2. Alternatively, the first test signal may be supplied to the first test pad TVP1, and the second test signal may be supplied to the second test pad TVP2.

The initialization transistors IT1, IT2, and IT3 may be coupled between the data lines D1 to Dm and the initialization pads IVP1, IVP2, and IVP3. The first initialization transistors It1 may be coupled between the data lines and the first initialization pads IVP1. The second initialization transistors IT2 may be coupled between the data lines and the second initialization pads IVP2. The third initialization transistors IT3 may be coupled between the data lines and the third initialization pads IVP3. The control electrodes of the first initialization transistors IT1 may be coupled to the first initialization control pad IP1. The control electrodes of the second initialization transistors IT2 may be coupled to the first initialization control pad IP2. The control electrodes of the third initialization transistors IT3 may be coupled to the third initialization control pad IP3.

For example, each control electrode of the first initialization transistors IT1 may be coupled to the first initialization control pad IP1, the first electrode may be coupled to any one of the data lines D1 to Dm, and the second electrode may be coupled to the first initialization control pads IVP1. Each control electrode of the second initialization transistors IT2 may be coupled to the second initialization control pad IP2, the first electrode may be coupled to any one of the data lines D1 to Dm, and the second electrode may be coupled to the second initialization control pads IVP2. Each control electrode of the third initialization transistors IT3 may be coupled to the third initialization control pad IP3, the first electrode may be coupled to any one of the data lines D1 to Dm, and the second electrode may be coupled to the third initialization control pads IVP3.

Adjacent first and second initialization transistors IT1 and IT2 may be coupled to one data line. The third initialization transistor IT3 adjacent to the first and second initialization transistors IT1 and IT2 may be coupled to a different data line. For example, the first and second initialization transistors IT1 and IT2, which are adjacent to each other, may be coupled to the first data line D1. The third initialization transistor IT3, which is adjacent to the first and second initialization transistors IT1 and IT2, may be coupled to the second data line D2 as shown in FIG. 9.

The first test transistors TT1 may be coupled between the data lines D1 to Dm and the test pads TVP1 and TVP2. The control electrodes of the first test transistors TT1 may be coupled to the first test control pad TP1. For example, each control electrode of the first test transistors TT1 may be coupled to the first test control pad TP1, the first electrode may be coupled to any one of the test pads TVP1 and TVP2, and the second electrode may be coupled to any one of the data lines D1 to Dm.

The outline may be between the first electrode of the first test transistor TT1 and the test pad. For example, as shown in FIG. 3, the first outline OL1 may be between the first electrode of the first test transistor TT1 coupled to the first data line D1 and the first test pad TVP1. A second outline OL2 may be between the first electrode of the first test transistor TT1 coupled to the m-th data line Dm and the second test pad TVP2. For example, the first outline OL1 may be coupled between the first electrode of the first test transistor TT1, that is coupled to the first data line D1 and the first test pad TVP1. The second outline OL2 may be coupled between the first electrode of the first test transistor TT1, that is coupled to the m-th data line Dm and the second test pad TVP2.

Each of the outlines OL1 and OL2 may be outside the display area DA. For example, the first outline OL1 may be outside of the left side and outside the upper side of the display area DA. The second outline OL2 may be outside the right side and outside of the upper side of the display area DA. Also, when the scan driver 20 is in the non-display area NDA outside of one side of the display area DA, the outlines OL1 and OL2 may be further outside than the scan driver 20. Also, the outlines OL1 and OL2 may be on the outermost side, among the structures at the array substrate LS, to surround the structures at the array substrate LS. The structures at the array substrate LS may refer to any structure other than the pads.

For example, each of the outlines OL1 and OL2 may be adjacent to and at least partially go around the display area DA once. In one embodiment, the first outline OL1 may be adjacent to and go around the left side and upper side of the display area DA once, and the second outline OL2 may be adjacent to and go around the outside of the right side and upper side of the display area DA once.

A voltage value difference may exist between the test signal supplied to the first test transistors TT1 via the outlines OL1 and OL2 (from the test pads TVP1 and TVP2) and the test signal supplied to the first test transistors TT1 without passing through the outlines OL1 and OL2 (from the test pads TVP1 and TVP2). This voltage value difference voltage value difference may occur because of a difference in wire resistances between the outlines OL1 and OL2.

To prevent the voltage value difference from occurring, resistances R may be placed between the first electrodes of the first test transistors TT1 (which are not coupled to the outlines OL1 and OL2) and the test pads TVP1 and TVP2. As a result, any voltage value difference in test signal attributable to wire resistances of the outlines OL1 and OL2 may be reduced or minimized. For example, a resistance value of the first outline OL1, a resistance value of the second outline OL2, and a resistance value of the resistance R may be set to be substantially the same in order to reduce or minimize the voltage value difference in test signal due to wire resistances of the outlines OL1 and OL2. An example of the resistances R is explained above with reference to FIGS. 6, 7A and 7B.

According to one embodiment, in the array substrate LS of the display panel, the initialization transistors IT1, IT2, and IT3 are in the upper non-display area NDA. Also, in this embodiment, the data pads DP1 to DPm, the initialization control pads IP1, IP2, and IP3, the first test control pad TP1, the initialization pads IVP1, IVP2, and IVP3, the test pads TVP1 and TVP2, the first test transistors TT1 and the resistances R are in the lower non-display area NDA. The arrangement of the data pads DP1 to DPm, the initialization control pads IP1, IP2 and IP3, the first test control pad TP1, the initialization pads IVP1, IVP2, and IVP3 and the test pads TVP1 and TVP2 may be different in another embodiment.

As discussed above, in the embodiment of FIG. 3, the initialization transistors that initialize the data lines D1 to Dm are coupled to the data pads DP1 to DPm, while in the embodiment of FIG. 9 the initialization transistors that initialize the data lines D1 to Dm are coupled to the initialization pads IVP1, IVP2, and IVP3. Also, in the embodiment of FIG. 3, the first test transistors TT1 and the resistances R are in the upper non-display area NDA and the initialization transistors IT1, IT2, and IT3 are in the lower non-display area NDA, while in the embodiment of FIG. 9 the initialization transistors IT1, IT2, and IT3 are in the upper non-display area NDA and the first test transistors TT1 and the resistances R are in the lower non-display area NDA.

The signals supplied to the display panel in the embodiment of FIG. 9 may be substantially the same as FIG. 4. For example, the initialization control signals IS1, IS2, and IS3 supplied to the initialization control pads IP1, IP2, and IP3, the test control signal TS supplied to the first test control pad TP1, the initialization signal IV supplied to the initialization pads IVP1, IVP2, and IVP3, the test signal TV supplied to the test pads TVP1 and TVP2, and the scan signals SCAN1, SCAN2, SCAN3, and SCANn supplied to the scan lines S1 to Sn may be substantially the same as FIG. 4. The signals supplied to the display panel in the embodiment of FIG. 9 may be different from those in FIG. 4 in another embodiment. Also, the method for inspecting cracks of the display panel according to the embodiment of FIG. 9 may be substantially the same as in FIGS. 3 and 4, but this also is not a necessity.

Figure 10:
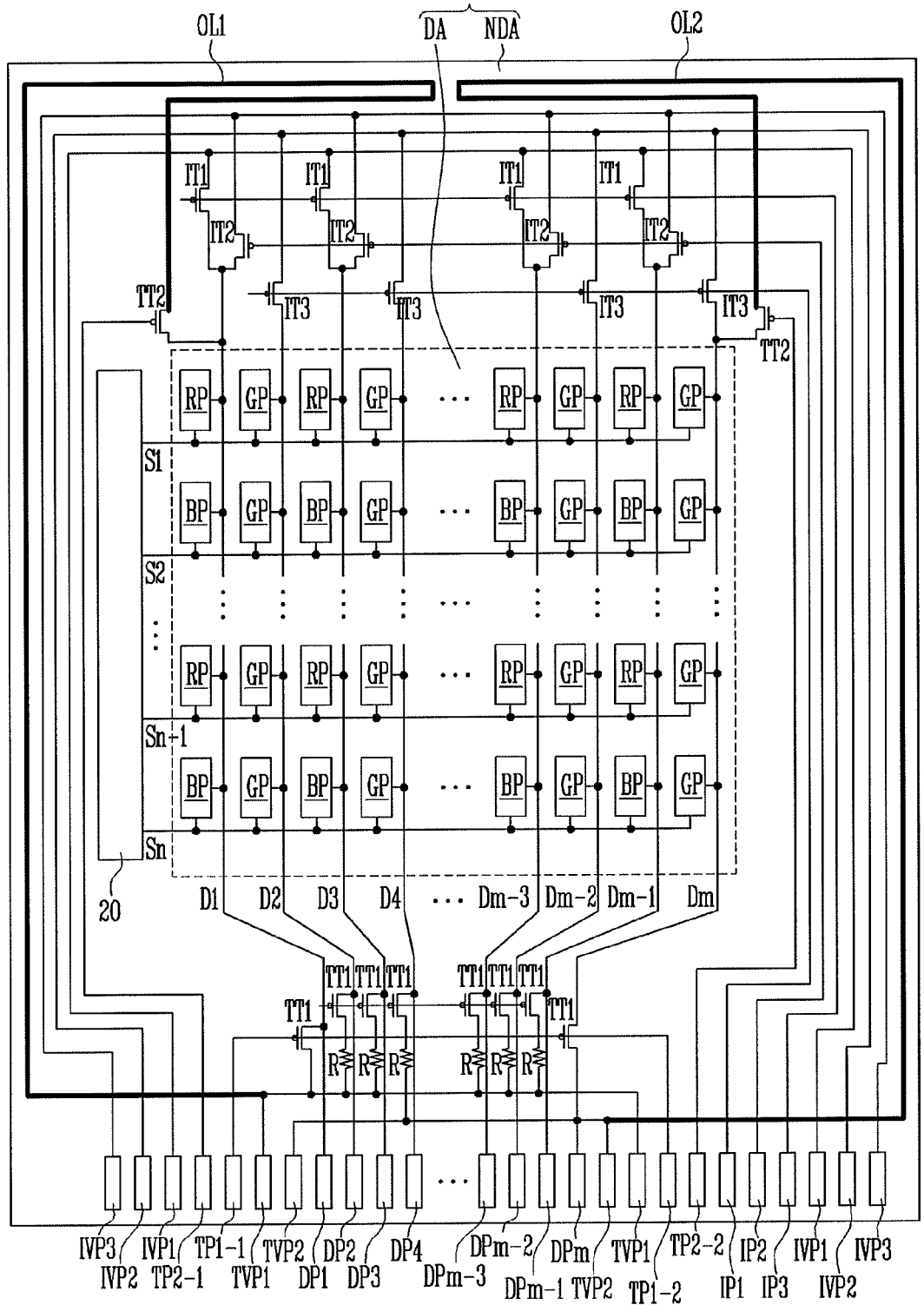
FIG. 10 illustrates an embodiment of a lower side of a display panel.

FIG. 10 illustrates another embodiment of the array substrate of the display panel 10. Referring to FIG. 10, the display panel 10 includes the array substrate LS and the opposite substrate. The array substrate LS is divided into the display area DA including pixels P for displaying images and non-display area NDA outside the display area DA.

The pixels P are in the display area DA of the array substrate LS. The data pads DP1 to DPm, the initialization control pads IP1, IP2, and IP3, the initialization pads IVP1, IVP2, and IVP3, test control pads TP1-1, TP1-2, TP2-1, and TP2-2, the test pads TVP1 and TVP2, the initialization transistors IT1, IT2, and IT3, the test transistors TT1 and TT2, the resistances R and the outlines OL1 and OL2 are in the non-display area DA of the array substrate LS. The pixels P, the data pads DP1 to DPm, the initialization control pads IP1, IP2, and IP3, the initialization pads IVP1, IVP2, and IVP3, the test pads TVP1 and TVP2, and the initialization transistors IT1, IT2, and IT3 of the array substrate LS of the display panel 10 in FIG. 10 may be substantially the same as the embodiment in FIG. 9, but this is not a necessity.

The first test control pads TP1-1 and TP1-2 are coupled to control electrodes of the first test transistors TT1. The (1-1)-th test control pads TP1-1 are coupled to a control electrode of the first test transistor TT1 coupled to the first data line D1 and a control electrode of the first test transistor TT1 coupled to the m-th data line Dm. The (1-2)-th test control pad TP1-2 is coupled to control electrodes of the first test transistor TT1 coupled to the remaining data lines D2 to Dm−1. The first test control signal may be supplied to the first test control pads TP1-1 and TP1-2.

The embodiment of FIG. 10 further includes second test transistors TT2 and second test control pads TP2-1 and TP2-2. The second test control pads TP2-1 and TP2-2 are coupled to control electrodes of the second test transistors TT2. The (2-1)-th test control pad TP2-1 are coupled to a control electrode of a second test transistor TT2 coupled to the first data line D1. The (2-2)-th test control pad TP2-2 is coupled to a control electrode of the second test transistor TT2 coupled to the m-th data line Dm. The second test control signal is supplied to the second test control pads TP2-1 and TP2-2.

The first test transistors TT1 are coupled between the data lines D1 to Dm and the test pads TVP1 and TVP2. The control electrodes of the first test transistors TT1 are coupled to the first test control pads TP1-1 and TP1-2. For example, each control electrode of the first test transistors TT1 is coupled to one of the first test control pads TP1-1 or TP1-2, the first electrode is coupled to one of the test pads TVP1 or TVP2, and the second electrode is coupled to one of the data lines D1 to Dm.

The second test transistors TT2 are coupled between the data lines D1 to Dm and the outlines OL1 and OL2. The control electrodes of the second test transistors TT2 are coupled to the second test control pads TP2-1 and TP2-2. For example, each control electrode of the second test transistors TT2 is coupled to one of the second test control pads TP2-1 or TP2-2, the first electrode is coupled to one of the outlines OL1 or OL2, and the second electrode is coupled to one of the data lines D1 to Dm.

The outlines OL1 and OL2 are coupled between the second test transistors TT2 and the test pads TVP1 and TVP2. The first outline OL1 is coupled between the first electrode of the second test transistor TT2 coupled to the first data line D1 and the first test pad TVP1. The second outline OL2 is coupled between the first electrode of the second test transistor TT2 coupled to the m-th data line Dm and the second test pad TVP2.

Each of the outlines OL1 and OL2 may be outside of the display area DA. For example, the first outline OL1 may be adjacent to and outside the left side and upper side of the display area DA. The second outline OL2 may be outside the right side and upper side of the display area DA. Also, when the scan driver 20 is in the non-display area NDA adjacent one side of the display area DA, the outlines OL1 and OL2 may be further outside than the scan driver 20. Also, the outlines OL1 and OL2 may be on the outermost side to surround the structures at the array substrate LS. These structures may refer to any structure other than the pads.

A voltage value difference may exist between the test signal supplied to the second test transistors TT2 via the outlines OL1 and OL2 (from the test pads TVP1 and TVP2) and the test signal supplied to the first test transistors TT1 without passing through the outlines OL1 and OL2 (from the test pads TVP1 and TVP2). The voltage value difference may occur as a result of differences in wire resistances of the outlines OL1 and OL2.

To prevent the voltage value difference from occurring, resistances R may be placed between the first electrodes of the first test transistors TT1 not coupled to the outlines OL1 and OL2 and the test pads TVP1 and TVP2. As a result, the voltage value difference in test signal due to differences of resistance values in wire resistances of the outlines OL1 and OL2 may be reduced or minimized. For example, the resistance value of the first outline OL1, the resistance value of the second outline OL2, and the resistance value of the resistance R may be substantially the same in order to reduce or minimize the difference in test signals due to wire resistances of the outlines OL1 and OL2. An example of the resistances R is explained above with reference to FIGS. 6, 7A, and 7B.

In the embodiment of FIG. 10, in the array substrate LS of the display panel, the initialization transistors IT1, IT2, and IT3 and the second test transistors TT2 are in the upper non-display area NDA and the data pads DP1 to DPm, the initialization control pads IP1, IP2, and IP3, the test control pads TP1-1, TP1-2, TP2-1, and TP2-2, the initialization pads IVP1, IVP2, and IVP3, the test pads TVP1 and TVP2, the first test transistors TT1, and the resistances R are in the lower non-display area NDA. The arrangement of the data pads DP1 to DPm, the initialization control pads IP1, IP2, and IP3, the first test control pad TP1, the initialization pads IVP1, IVP2, and IVP3, and the test pads TVP1 and TVP2 may be different in another embodiment.

The signals supplied to the display panel in the embodiment of FIG. 10 may be substantially the same as FIG. 4. For example, the initialization control signals IS1, IS2, and IS3 supplied to the initialization control pads IP1, IP2, and IP3, the test control signal TS supplied to the test control pads TP1-1, TP1-2, TP2-1, and TP2-2, the initialization signal IV supplied to the initialization pads IVP1, IVP2, and IVP3, the test signal TV supplied to the test pads TVP1 and TVP2, and the scan signals SCAN1, SCAN2, SCAN3, and SCANn supplied to the scan lines S1 to Sn may be substantially the same as FIG. 4, but this is not a necessity. Also, the method for inspecting cracks of the display panel corresponding to the embodiment of FIG. 10 may be substantially the same as in FIGS. 3 and 4, but this is not a necessity.

Figure 11:
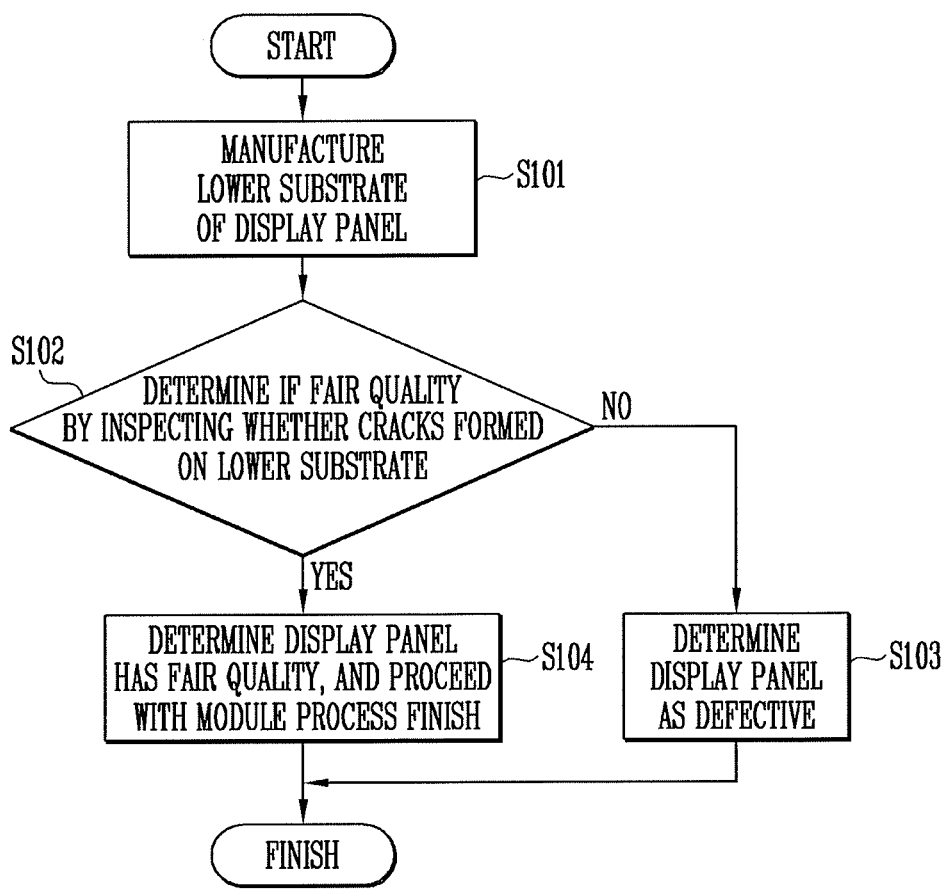
FIG. 11 illustrates an embodiment of a method for manufacturing a display.

FIG. 11 illustrating an embodiment of a method for manufacturing a display device. The method includes manufacturing the array substrate LS of the display panel 10 (S101). The array substrate LS of the display panel 10 may be manufactured, for example, according to the embodiments of FIG. 3, 8, 9, or 10.

Next, an inspection is performed to determine whether there are cracks on the array substrate LS of the display panel 10 (S102). Inspection of the cracks on the array substrate LS may be performed, for example, according to the method described with reference to FIGS. 3 and 4. When cracks are determined to exist on the array substrate LS of the display panel 10, the array substrate LS may be determined as defective (S103).

When no cracks are determined to exist on the array substrate LS of the display panel 10, the array substrate LS may be determined as having fair quality and a module process may be performed (S104). For example, if the array substrate LS is determined as having fair quality, the opposite substrate may be attached to the array substrate LS of the display panel 10, the flexible film to which the source drive IC is mounted may be attached to the array substrate, the flexible film may be attached to the source printed circuit board, and the control printed circuit board to which the timing controller is mounted and the source printed circuit board may be coupled using the flexible cable.

In this embodiment, inspection may be performed to determine whether cracks have occurred on the array substrate LS before performing the module process. When the array substrate LS is determined to have cracks, the array substrate LS is identified as defective. As a result, a waste of manufacturing costs is prevent by not performing a module process for a defective display panel.

Figure 12:
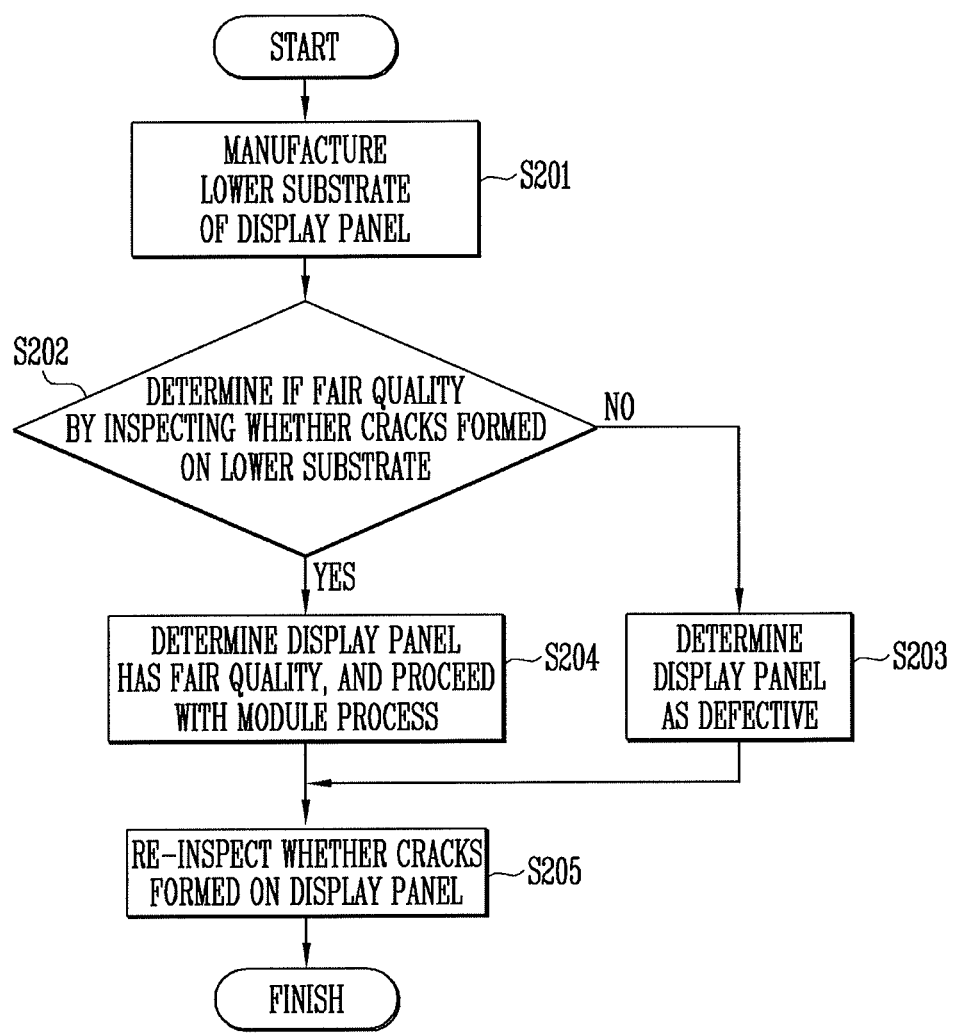
FIG. 12 illustrates another embodiment of a method for manufacturing a display.

FIG. 12 illustrates another embodiment of a method for manufacturing a display device. In this embodiment, operations S201 to S204 may be substantially the same as operations S101 to S104 in FIG. 11.

Additionally, an operation 205 may be included in which re-inspection is performed to determine whether there are cracks on the array substrate LS of the display panel 10 after the module process is completed. This re-inspection operation may be performed because cracks may occur on the array substrate LS due to impact during the module process. By performing this re-inspection operation, the release of defective products may be reduced or minimized.

The inspection of cracks on the array substrate LS may be performed according to the crack inspection method of the display panel as in FIGS. 3 and 4. Additionally, or alternatively, the array substrate LS of the display panel 10 may be manufactured according to the embodiment in FIG. 3 or 8.

When the array substrate LS is manufactured according to the embodiment of FIG. 9 or 10, the source drive IC may be coupled to the test control pads coupled to control electrodes of the first test transistors TT1 due to module process. Also, the source drive IC may supply the first gate off voltage value Voff1 to the test control pads. Therefore, it may be difficult to inspect whether cracks have occurred on the array substrate LS of the display panel 10 after module process is completed.

Thus, according to the present embodiment, re-inspection may be performed to determine whether cracks have occurred on the array substrate LS after module process is performed The display panel 10 may be determined to be defective if cracks are determined to have occurred. As a result, the release of a display panel with cracks on the array substrate LS (e.g., which occurred both before and during module process) may be prevented.

By way of summation and review, according to one embodiment, initialization signals may be supplied via initialization transistors during a first period, and test signals may be supplied through the first test transistors during a second period. As a result, a determination may be made as to whether cracks have occurred in the display area of the array substrate, for example, based on disconnection or change in wire resistances of the data lines.

According to this or another embodiment, outlines may be in a non-display area (outside a display area) of the array substrate. As a result, a determination may be made as to whether cracks have occurred in the non-display area of the array substrate, for example, based on disconnection or a change in wire resistances of the outline caused by the cracks.

According to this or another embodiment, resistances may be placed between the first test transistors (not coupled to the outlines) and the test pads to which test signals are supplied. As a result, a voltage value difference in the test signals due to differences in wire resistances of the outlines may be reduced or minimized.

According to this or another embodiment, the outlines may be coupled to the data lines, that are coupled to the predetermined color (e.g., green) of pixels or sub-pixels through the test transistors. Because human perception capability for green color is superior to red or blue color, it may be easier to determine whether cracks have occurred at the non-display area. Thus, the resistances may only be placed at the test transistors coupled to the data lines coupled to the green pixels, or sub-pixels, among the test transistors not coupled to the outlines. As a result, the resistances may be reduced, and circuit complexity may be reduced. In another embodiment, the resistances may be placed for all color pixels or sub-pixels or a subset of the color pixels or sub-pixels including or excluding green.

According to this or another embodiment, a determination may be made as to whether cracks have occurred on the array substrate before a module process is performed. An array substrate with cracks may be determined as defective. As a result, a module process may not be performed for defective display panels and, thus, manufacturing costs may not be wasted.

According to this or another embodiment, a re-inspection operation may be performed to determine whether cracks have occurred on the array substrate after a module process is performed. Display panels with cracks may be determined as defective. As a result, the release of display panels with cracks that have occurred on the array substrate during the module process may be prevented.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A display device, comprising:
a display area including pixels coupled to data lines and scan lines;
a test pad to receive a test signal;
a plurality of first test transistors coupled between the data lines of the display area and the test pad; and
at least one outline coupled between one of the first test transistors and the test pad, the at least one outline in a non-display area outside the display area, wherein the at least one outline traverses a path that goes and returns along the at least one side of the display area and is adjacent to the at least one side of the display area.

2. The display device as claimed in claim 1, wherein:
the first test transistor is coupled to the at least one outline,
the at least one outline is coupled to a data line, and
the data line is coupled to at least one green pixel or sub-pixel in the display area.

3. The display device as claimed in claim 1, further comprising: a resistance between one of the first test transistors that is not coupled to the at least one outline and the test pad.

4. The display device as claimed in claim 1, further comprising:
a test control pad coupled to control electrodes of the first test transistors;
a plurality of initialization transistors coupled between the data lines of the display area and data pads to receive initialization signals; and
a plurality of initialization control pads coupled to control electrodes of the initialization transistors.

5. The display device as claimed in claim 4, further comprising:
a plurality of data pads coupled to the data lines.

6. The display device as claimed in claim 5, wherein the test pad, the test control pad, the initialization control pads, the data pads, the test transistors, the initialization transistors, and the at least one outline are in the non-display area.

7. The display device as claimed in claim 4, wherein the test control pad is to receive a test control signal different from an initialization control signal received by one of the initialization control pads, the test control signal and the initialization control signal corresponding to different gray level values.

8. The display device as claimed in claim 7, wherein:
scan signals are coupled to the scan lines within a period during which the test control signal is supplied as first gate-on voltage value, and
the scan signals are supplied as second gate-on voltages value.

9. The display device as claimed in claim 1, further comprising:
a plurality of first test control pads coupled to control electrodes of the first test transistors;
a plurality of initialization transistors coupled between the data lines in the display area and initialization pads to receive initialization signals;
a plurality of initialization control pads coupled to control electrodes of the initialization transistors;
a second test transistor coupled between one of the data lines and the at least one outline;
a second test control pad coupled to a control electrode of the second test transistor; and a plurality of data pads coupled to the data lines.

10. The display device as claimed in claim 9, wherein the first and second test control pads are to receive a test control signal opposite to an initialization control signal received by one of the initialization control pads.

11. The display device as claimed in claim 10, wherein scan signals coupled to the scan lines are supplied as second gate-on voltages, during a period when the test control signal is supplied as a first gate-on voltage.

12. The display device as claimed in claim 9, wherein the test pad, the first and second test control pads, the initialization control pads, the data pads, the first and second test transistors, the initialization transistors, and the at least one outline are in the non-display area.

13. The display device as claimed in claim 1, wherein the at least one outline has a length adjacent to at least one side of the display area that is equal to or greater than a length of the at least one side.

\* \* \* \* \*